US012641955B2

(12) United States Patent
Shen et al.

(10) Patent No.: US 12,641,955 B2
(45) Date of Patent: May 26, 2026

(54) DISPLAY SUBSTRATE, PREPARATION METHOD THEREOF, DISPLAY PANEL AND DISPLAY APPARATUS

(71) Applicant: BOE TECHNOLOGY GROUP CO., LTD., Beijing (CN)

(72) Inventors: Kuo Shen, Beijing (CN); Qixiao Wu, Beijing (CN); Wenxiu Zhu, Beijing (CN); Shanshan Bai, Beijing (CN); Na Bi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 585 days.

(21) Appl. No.: 18/028,778

(22) PCT Filed: Mar. 28, 2022

(86) PCT No.: PCT/CN2022/083389
§ 371 (c)(1),
(2) Date: Mar. 28, 2023

(87) PCT Pub. No.: WO2023/184090
PCT Pub. Date: Oct. 5, 2023

(65) Prior Publication Data
US 2025/0081727 A1     Mar. 6, 2025

(51) Int. Cl.
*H10K 59/121* (2023.01)
*H10K 59/12* (2023.01)
(Continued)

(52) U.S. Cl.
CPC ....... *H10K 59/121* (2023.02); *H10K 59/1201* (2023.02); *H10K 59/38* (2023.02); *H10K 59/60* (2023.02)

(58) Field of Classification Search
CPC .. H10K 59/121; H10K 59/1201; H10K 59/60; H10K 59/65
See application file for complete search history.

(56) References Cited

U.S. PATENT DOCUMENTS

| | | |
|---|---|---|
| 2019/0267497 A1 | 8/2019 | Kawai |
| 2021/0096678 A1* | 4/2021 | Kubota ................. G06F 3/0412 |
| 2021/0296409 A1* | 9/2021 | Yamazaki ............. H05B 33/02 |

FOREIGN PATENT DOCUMENTS

| | | |
|---|---|---|
| CN | 112578933 A | 3/2021 |
| CN | 113728372 A | 11/2021 |

(Continued)

*Primary Examiner* — Douglas M Menz
(74) *Attorney, Agent, or Firm* — HOUTTEMAN LAW LLC

(57) ABSTRACT
A display substrate, including repetitive units; where each repetitive unit includes first, second and third light-emitting element and photoelectric conversion elements; the first and third light-emitting elements are of a same number; the second light-emitting elements and the photoelectric conversion elements are of a same number; second light-emitting elements are twice as many as the first light-emitting element; the first, second and third light-emitting elements are sequentially arranged along first direction; the second light-emitting elements and the photoelectric conversion elements are sequentially arranged along second direction, respectively; an angle between the first and second direction is >0° and ≤90°; the photoelectric conversion elements and the second light-emitting elements are adjacently arranged and distributed in one-to-one correspondence; any set of corresponding second light-emitting element and photoelectric conversion element are arranged along the first direction; the first or third light-emitting element is located between two adjacent photoelectric conversion elements.

20 Claims, 5 Drawing Sheets

(51) Int. Cl.
   *H10K 59/38*          (2023.01)
   *H10K 59/60*          (2023.01)

(56)                    References Cited

FOREIGN PATENT DOCUMENTS

JP          2020013043  A      1/2020
WO      WO2021250507  A1    12/2021

* cited by examiner

DISPLAY SUBSTRATE, PREPARATION METHOD THEREOF, DISPLAY PANEL AND DISPLAY APPARATUS

TECHNICAL FIELD

Embodiments of the present disclosure belong to the field of display technology, and specifically relate to a display substrate, a preparation method thereof, a display panel and a display apparatus.

BACKGROUND

In the existing art, a color filter layer (including color filters and a black matrix) is typically provided on a light-emitting side of an organic light-emitting diode (OLED, also called organic electroluminescent, organic light-emitting semiconductor) display substrate, which can improve the color gamut and color purity, and thus the display effect, of the OLED display substrate.

SUMMARY

Embodiments of the present disclosure provide a display substrate, a preparation method thereof, a display panel and a display apparatus.

In a first aspect, an embodiment of the present disclosure provides a display substrate, including: a plurality of repetitive units; wherein each repetitive unit includes a first light-emitting element, second light-emitting elements, a third light-emitting element, and photoelectric conversion elements;

the first light-emitting element and the third light-emitting element are provided in a same number; the second light-emitting elements and the photoelectric conversion elements are provided in a same number; the second light-emitting elements are twice as many as the first light-emitting element;

the first light-emitting element, the second light-emitting elements, and the third light-emitting element are sequentially arranged along a first direction; the second light-emitting elements are sequentially arranged along a second direction; the photoelectric conversion elements are sequentially arranged along the second direction;

an angle between the first direction and the second direction is larger than 0° and smaller than or equal to 90°;

the photoelectric conversion elements and the second light-emitting elements are adjacently arranged and distributed in one-to-one correspondence; any set of corresponding second light-emitting element and photoelectric conversion element are arranged along the first direction; and the first light-emitting element or the third light-emitting element is located between two adjacent photoelectric conversion elements.

In some embodiments, in the repetitive unit, a quantity of the first light-emitting element is one, and a quantity of second light-emitting elements is two;

the two second light-emitting elements are respectively disposed at an upper side and a lower side of a connection line between centers of light-emitting regions of the first light-emitting element and the third light-emitting element; and the photoelectric conversion elements whose quantity is two are respectively disposed at the upper side and the lower side of the connection line between centers of the light-emitting regions of the first light-emitting element and the third light-emitting element.

In some embodiments, in the repetitive unit, centers of light-emitting regions of the two second light-emitting elements have an equal distance to the connection line between centers of the light-emitting regions of the first light-emitting element and the third light-emitting element; and centers of light-receiving regions of the two photoelectric conversion elements have an equal distance to the connection line between centers of the light-emitting regions of the first light-emitting element and the third light-emitting element.

In some embodiments, the first direction is perpendicular to the second direction; and in the repetitive unit, a distance between the center of the light-emitting region of one of the second light-emitting elements and the center of the light-receiving region of one of the photoelectric conversion elements in one corresponding set is equal to a distance between the center of the light-emitting region of the other of the second light-emitting element and the center of the light-receiving region of the other of the photoelectric conversion elements in the other corresponding set.

In some embodiments, in the repetitive unit, the centers of the light-emitting regions of the first light-emitting element and the third light-emitting element are located on a same straight line in the first direction.

In some embodiments, the light-emitting region of the first light-emitting element has a first maximum width in the first direction, and a second maximum width in the second direction;

0.67≤a ratio of the first maximum width to the second maximum width ≤1.5;

the first maximum width ≥20 μm; and the second maximum width ≥20 μm.

In some embodiments, the light-emitting region of the third light-emitting element has a third maximum width in the first direction, and a fourth maximum width in the second direction;

0.67≤a ratio of the third maximum width to the fourth maximum width ≤1.5;

the third maximum width ≥20 μm; and the fourth maximum width ≥20 μm.

In some embodiments, in the repetitive unit, the light-emitting regions of the two second light-emitting elements has a minimum distance larger than or equal to 20 μm.

In some embodiments, the light-receiving region of each photoelectric conversion element has an area greater than 100 μm².

In some embodiments, the plurality of repetitive units are arranged in an array, with a row direction of the array along the first direction and a column direction of the array along the second direction;

repetitive units in any two adjacent rows of repetitive units are located in different columns;

photoelectric conversion elements which are close to each other along the second direction in any two adjacent rows of repetitive units are located on a same straight line in the first direction;

an $m^{th}$ repetitive unit in an $n^{th}$ row of repetitive units and an $m^{th}$ repetitive unit in an $(n+2)^{th}$ row of repetitive units are located on a same straight line in the second direction, where n=1, 2, 3 . . . , and n is an integer, m=1, 2, 3 . . . , and m is an integer; and in the array, a distance between any two adjacent photoelectric conversion elements on a same straight line in the second direction is equal to a distance between any two adjacent photoelectric conversion elements on a same straight line in the first direction.

In some embodiments, in two adjacent repetitive units in two adjacent but different rows, the center of the light-receiving region of the photoelectric conversion element located between two second light-emitting elements adjacent in the first direction has an equal distance to the centers of the light-emitting regions of the two second light-emitting elements.

In some embodiments, each photoelectric conversion element includes a functional layer;

the first light-emitting element and the third light-emitting element each include a light-emitting layer; and at least one side of the functional layer is parallel to at least one side of the light-emitting layer of the first light-emitting element or the third light-emitting element adjacent thereto.

In some embodiments, the light-emitting region of the first light-emitting element has any one of a circular shape, an elliptical shape, a triangular shape, a rectangular shape, a diamond shape or a regular polygon shape;

the light-emitting region of the third light-emitting element has any one of a circular shape, an elliptical shape, a triangular shape, a rectangular shape, a diamond shape or a regular polygon shape; and the light-receiving region of each photoelectric conversion element has any one of a square shape, a circular shape, or a regular polygon shape.

In some embodiments, the light-emitting region of each second light-emitting element has a strip shape whose length direction is along the second direction In some embodiments, the display substrate further includes a color filter layer on a light-emitting side of the repetitive unit; wherein the color filter layer includes color filters and a black matrix;

the display substrate further includes a substrate and a pixel defining layer on the substrate;

the pixel defining layer has a plurality of openings provided therein, and the first light-emitting element, the second light-emitting elements, the third light-emitting element and the photoelectric conversion elements are respectively located in the openings in one-to-one correspondence;

the first light-emitting element is a red light-emitting element; each second light-emitting element is a green light-emitting element; the third light-emitting element is a blue light-emitting element;

the color filters include a red color filter, a green color filter, and a blue color filter;

an orthographic projection of the red color filter on the substrate is overlapped with the light-emitting region of the first light-emitting element; an orthographic projection of the green color filter on the substrate is overlapped with the light-emitting region of each second light-emitting element; an orthographic projection of the blue color filter on the substrate is overlapped with the light-emitting region of the third light-emitting element; and an orthographic projection of the black matrix on the substrate is overlapped with the pixel defining layer.

In some embodiments, in a region of the repetitive unit, the black matrix has a uniform width which is smaller than a width of the pixel defining layer.

In some embodiments, in an overlap region of orthographic projections of the black matrix and the pixel defining layer, the black matrix has a first orthographic projection boundary and a second orthographic projection boundary in a width direction of the black matrix; the pixel defining layer has a third orthographic projection boundary and a fourth orthographic projection boundary in a width direction of the pixel defining layer;

the first orthographic projection boundary and the third orthographic projection boundary are located at one end of the black matrix along the width direction of the black matrix; the second orthographic projection boundary and the fourth orthographic projection boundary are located at the other end of the black matrix along the width direction of the black matrix; and a distance between the first orthographic projection boundary and the third orthographic projection boundary is equal to a distance between the second orthographic projection boundary and the fourth orthographic projection boundary.

In a second aspect, an embodiment of the present disclosure further provides a method for preparing a display substrate, including: forming a first light-emitting element, second light-emitting elements, a third light-emitting element, and photoelectric conversion elements in a repetitive unit by evaporation.

In some embodiments, two second light-emitting elements in the repetitive unit are simultaneously formed by evaporation through one mask opening in a metal mask.

In some embodiments, two photoelectric conversion elements in the repetitive unit are simultaneously formed by evaporation through two mask openings in a metal mask.

In a third aspect, an embodiment of the present disclosure further provides a display panel, including the display substrate as described above.

In a fourth aspect, an embodiment of the present disclosure further provides a display apparatus, including the display panel as described above.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art by describing in detail exemplary embodiments thereof with reference to the attached drawings, in which.

DETAIL DESCRIPTION OF EMBODIMENTS

Figure 1:
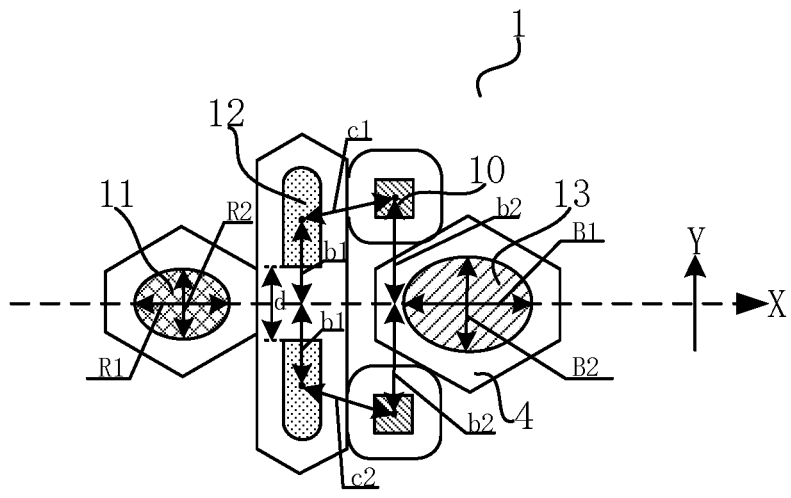
FIG. 1 is a top view of a repetitive unit in a display substrate according to an embodiment of the present disclosure.

In order to make those skilled in the art better understand the technical solutions in the embodiments of the present disclosure, the display substrate, the preparation method thereof, and the display apparatus provided in the embodiments of the present disclosure will be described in further detail below with reference to the accompanying drawings and specific implementations.

Embodiments of the present disclosure will be described more sufficiently below with reference to the accompanying drawings, which may be embodied in different forms and should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

Fingerprints are innate and unique for every person, and with the development of the market, fingerprint recognition has become one of the important functions of electronic products, gained attention from many electronic manufacturers and been applied to various electronic products, such as mobile phones, tablets, smart wearable devices, and the like. Therefore, before operating an electronic device with a fingerprint recognition function, a user can simply touch a fingerprint recognition module in the electronic device with a finger to complete authority verification, which simplifies the authority verification process.

Current fingerprint recognition schemes include a capacitive mode, an optical diode mode, an organic photo detector (OPD). With high light responsiveness, the OPD can implement full-screen fingerprint recognition with a high resolution, and due to a narrow response wavelength, is hard to be influenced by ambient light. The integration of the OPD into an OLED display panel for detection and recognition of biological information, such as fingerprints, by the OLED display panel has become a popular technical trend.

In the disclosed art, by combining an OPD optical fingerprint recognition technology with the display technology, a fingerprint recognition region can be placed in a display region, thereby solving the problem of a low occupation ratio of a display panel screen due to the fingerprint recognition region in a non-display region. However, the OPD is manufactured in the display region through an evaporation process, and aperture ratios of some pixels in the display panel have to be sacrificed, which may reduce a lifetime of the OLED display panel. Therefore, how to make the pixel design of an OLED display panel integrated with an OPD meet the product requirements has become a focus of attention.

At present, in order to take into account the display effect of an OLED display panel integrated with an OPD, a color filter layer is typically configured on a light-emitting side of the OLED display panel. The color filter layer includes color filters (CFs) and a black matrix (BM), which means that different colors of color filters correspond to different colors of OLED light-emitting elements, and the black matrix corresponds to a pixel defining layer. The pixel defining layer is configured to define an evaporation position of each OLED light-emitting element. In the OLED display panel, in the case of a same BM OUT value (i.e., at positions where the black matrix and the pixel defining layer are correspondingly overlapped with each other, two width boundaries of the black matrix have an equal horizontal distance to two corresponding width boundaries of the pixel defining layer), widths of light-emitting regions of different colors of OLED light-emitting elements are affected by the black matrix to different degrees when the OLED light-emitting elements emit light, and the degrees are negatively related to the widths of the light-emitting regions of the OLED light-emitting elements. Therefore, different arrangement modes of the different colors of OLED light-emitting elements in the OLED display panel integrated with the OPD have different degrees of friendliness to the OLED display panel configured with the color filter layer. Therefore, how to arrange the OLED light-emitting elements to achieve a better optical effect is desired to be considered in the design. For the OLED display panel integrated with the OPD, how to reduce an influence of the color filter layer on the light emitted from the OLED display panel configured with the color filter layer is also desired to be considered, so as to better implement the fingerprint recognition function of the OPD.

Figure 2:
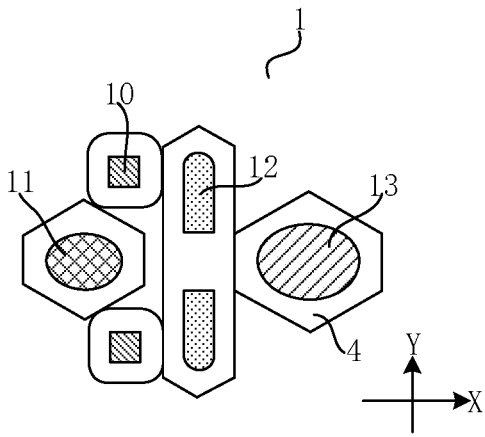
FIG. 2 is another top view of a repetitive unit in a display substrate according to an embodiment of the present disclosure.
Figure 3:
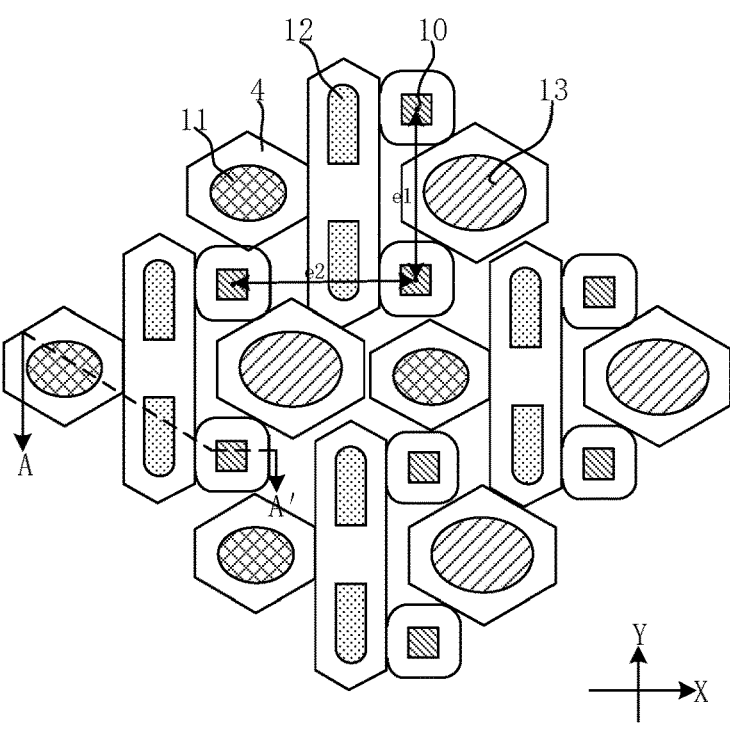
FIG. 3 is a top view illustrating an arrangement of repetitive units in a display substrate according to an embodiment of the present disclosure.
Figure 4:
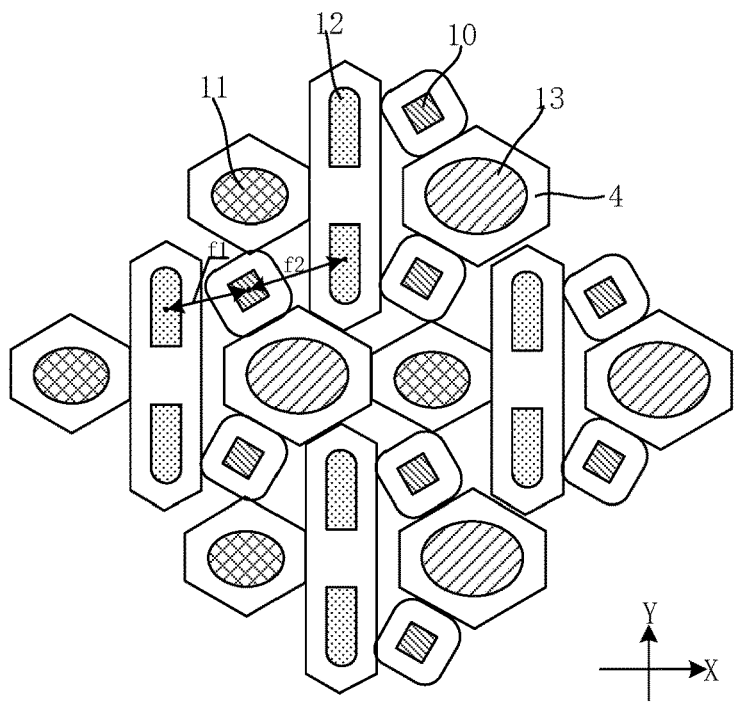
FIG. 4 is another top view illustrating an arrangement of repetitive units in a display substrate according to an embodiment of the present disclosure.
Figure 5:
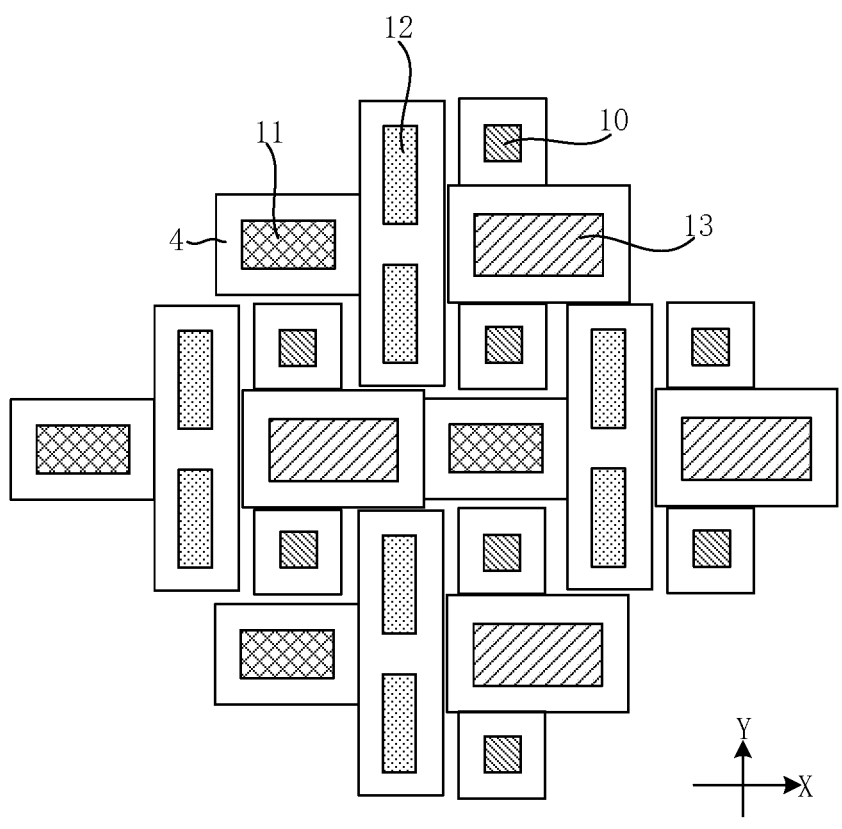
FIG. 5 is further another top view illustrating an arrangement of repetitive units in a display substrate according to an embodiment of the present disclosure.

In view of the above problems, in a first aspect, an embodiment of the present disclosure provides a display substrate. Referring to FIGS. 1 to 5, FIG. 1 is a top view of a repetitive unit in a display substrate according to an embodiment of the present disclosure; FIG. 2 is another top view of a repetitive unit in a display substrate according to an embodiment of the present disclosure; FIG. 3 is a top view illustrating an arrangement of repetitive units in a display substrate according to an embodiment of the present disclosure; FIG. 4 is another top view illustrating an arrangement of repetitive units in a display substrate according to an embodiment of the present disclosure; and FIG. 5 is further another top view illustrating an arrangement of repetitive units in a display substrate according to an embodiment of the present disclosure. The display substrate includes: a plurality of repetitive units 1. Each repetitive unit 1 includes a first light-emitting element 11, second light-emitting elements 12, a third light-emitting element 13, and photoelectric conversion elements 10. The first light-emitting element 11 and the third light-emitting element 13 are provided in a same number. The second light-emitting elements 12 and the photoelectric conversion elements 10 are provided in a same number. Second light-emitting elements 12 twice as many as the first light-emitting element 11 are provided. The first light-emitting element 11, the second light-emitting elements 12, and the third light-emitting element 13 are sequentially arranged along a first direction X. The second light-emitting elements 12 are sequentially arranged along a second direction Y. The photoelectric conversion elements 10 are sequentially arranged along the second direction Y. An angle between the first direction X and the second direction Y is larger than 0° and smaller than or equal to 90°. The photoelectric conversion elements 10 and the second light-emitting elements 12 are adjacently arranged and distributed in one-to-one correspondence. Any set of corresponding second light-emitting element 12 and photoelectric conversion element 10 are arranged along the first direction X. The first light-emitting element 11 is located between two adjacent photoelectric conversion elements 10; or the third light-emitting element 13 is located between two adjacent photoelectric conversion elements 10.

In some embodiments, in the repetitive unit 1, one first light-emitting element 11 is provided; two second light-emitting elements 12 are provided; the two second light-emitting elements 12 are respectively disposed at an upper side and a lower side of a connection line between centers of light-emitting regions of the first light-emitting element 11 and the third light-emitting element 13; and two photoelectric conversion elements 10 are respectively disposed at the upper side and the lower side of the connection line between centers of the light-emitting regions of the first light-emitting element 11 and the third light-emitting element 13.

Figure 6:
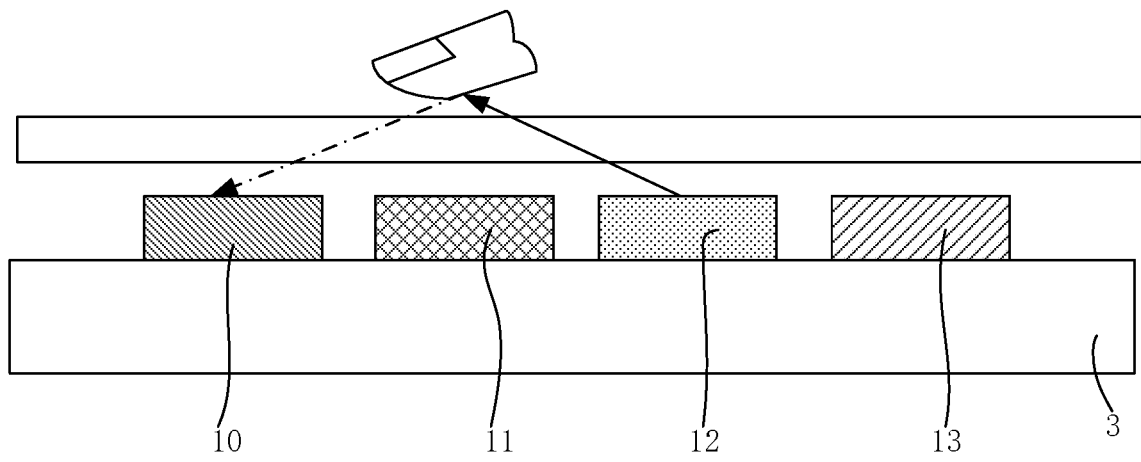
FIG. 6 is a schematic diagram of fingerprint recognition implemented by a photoelectric conversion element.

Referring to FIG. 6, a schematic diagram of fingerprint recognition implemented by a photoelectric conversion element is shown. Each photoelectric conversion element 10 may be an organic photoelectric conversion element. The photoelectric conversion element 10 may receive light emitted from different colors of light-emitting elements and reflected by ridges and valleys of a fingerprint, and convert the light into electric signals to be output, so as to implement detection of the fingerprint.

Figure 7:
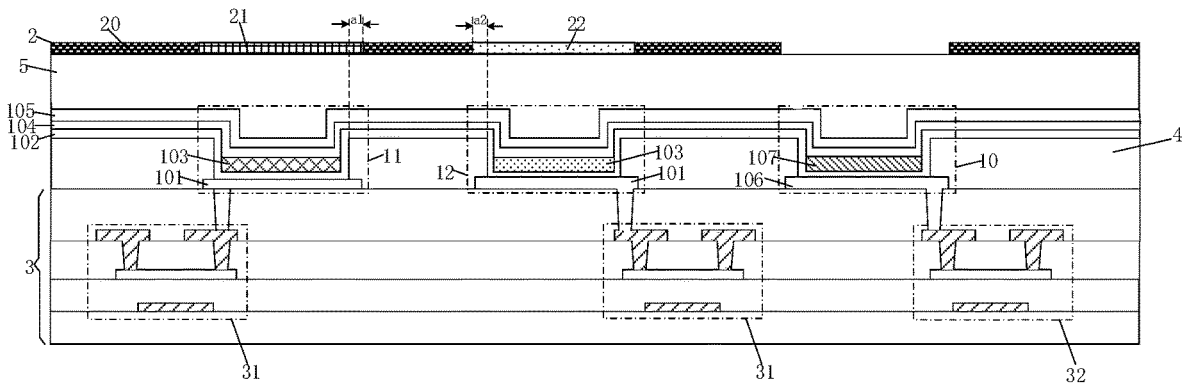
FIG. 7 is a structural cross-sectional view of the display substrate in FIG. 3 taken along line AA'.

In some embodiments, referring to FIG. 7, a structural cross-sectional view of the display substrate in FIG. 3 taken along line AA' is shown. The display substrate further includes a color filter layer 2 on a light-emitting side of the repetitive unit 1. The color filter layer 2 includes color filters and a black matrix 20. The display substrate further includes a substrate 3 and a pixel defining layer 4 on the substrate 3. A plurality of openings are formed in the pixel defining layer 4, and the first light-emitting element 11, the second light-emitting elements 12, the third light-emitting element 13 and the photoelectric conversion elements 10 are respectively located in the openings in one-to-one correspondence. The first light-emitting element 11 is a red light-emitting element. Each second light-emitting element 12 is a green light-emitting element. The third light-emitting element 13 is a blue light-emitting element. The color filters include a red color filter 21, a green color filter 22, and a blue color filter. An orthographic projection of the red color filter 21 on the substrate 3 is overlapped with the light-emitting region of the first light-emitting element 11. An orthographic projection of the green color filter 22 on the substrate 3 is overlapped with the light-emitting region of each second light-emitting element 12. An orthographic projection of the blue color filter on the substrate 3 is overlapped with the light-emitting region of the third light-emitting element 13. An orthographic projection of the black matrix 20 on the substrate 3 is overlapped with the pixel defining layer 4.

In some embodiments, the display substrate further includes a package layer 5 between the color filter layer 2 and the different colors of light-emitting elements. The package layer 5 is configured to package the different colors of light-emitting elements and the photoelectric conversion elements 10, and prevent external water and oxygen from intruding and damaging the light-emitting elements.

By providing different colors of color filters in the color filter layer 2, a display color gamut and a color purity of the display substrate are improved. By providing the black matrix 20 in the color filter layer 2, first light collimation holes respectively corresponding to the different colors of light-emitting elements may be formed on sides of the different colors of light-emitting elements facing away from the substrate 3, so that light emitted from the different colors of light-emitting elements is collimated and emitted or irradiated to the fingerprint after passing through the first light collimation holes corresponding to the different colors of light-emitting elements. Meanwhile, second light collimation holes corresponding to the photoelectric conversion elements 10 may be formed on sides of the photoelectric conversion elements 10 facing away from the substrate 3, so that the light reflected by the fingerprint are irradiated to the photoelectric conversion elements 10 after passes through the second light collimation holes. The first light collimation holes can shield stray light except the collimated light emitted from the different colors of light-emitting elements, or the collimated light irradiated to the fingerprint. The second light collimation holes can shield stray light except the collimated light reflected by the fingerprint and then emitted into the photoelectric conversion elements 10, so as to improve the detection precision of the photoelectric conversion elements 10 for fingerprints. In addition, by providing the black matrix 20, stray light emitted from the different colors of light-emitting elements and directly irradiated to the photoelectric conversion elements 10 without being reflected by the fingerprint can be shielded. Such stray light is reflected by the black matrix 20 and irradiated to the fingerprint, and then to the photoelectric conversion elements 10 again after being reflected by the fingerprint, so that an amount of incident light reflected by the fingerprint on the photoelectric conversion elements 10 is increased, and the detection precision and detection efficiency of the photoelectric conversion elements 10 for fingerprints are also increased. Therefore, the provision of the color filter layer 2 improves the display effect of the display substrate on the one hand, and increases the detection precision and detection efficiency of the photoelectric conversion elements 10 for fingerprints on the other hand, so that a more accurate fingerprint recognition function can be achieved and the requirement of safer fingerprint payment can be met.

In some embodiments, in a region of the repetitive unit 1, the black matrix 20 has a uniform width which is smaller than a width of the pixel defining layer 4.

In some embodiments, in an overlap region of orthographic projections of the black matrix 20 and the pixel defining layer 4, the black matrix 20 has a first orthographic projection boundary and a second orthographic projection boundary in a width direction of the black matrix; the pixel defining layer 4 has a third orthographic projection boundary and a fourth orthographic projection boundary in a width direction of the pixel defining layer; the first orthographic projection boundary and the third orthographic projection boundary are located at one end of the black matrix 20 along the width direction of the black matrix; the second orthographic projection boundary and the fourth orthographic projection boundary are located at the other end of the black matrix 20 along the width direction of the black matrix; and a distance a1 between the first orthographic projection boundary and the third orthographic projection boundary is equal to a distance a2 between the second orthographic projection boundary and the fourth orthographic projection boundary. With such arrangement, the problem of different influence degrees of the black matrix 20 on the widths of the light-emitting regions of the different colors of light-emitting elements can be solved or avoided, and the display effect of the display substrate can be improved.

In some embodiments, each of the different colors of light-emitting elements includes a first electrode 101, a hole transport layer 102, a light-emitting layer 103, an electron transport layer 104, and a second electrode 105 which are sequentially stacked on the substrate 3. The photoelectric conversion element 10 includes a third electrode 106, a hole transport layer 102, a photoelectric conversion layer 107, an electron transport layer 104, and a second electrode 105 which are sequentially stacked on the substrate 3. The hole transport layer 102, the electron transport layer 104, and the second electrode 105 of the light-emitting element, and the hole transport layer 102, the electron transport layer 104, and the second electrode 105 of the photoelectric conversion element 10 are respectively covered by a same film layer. In other words, to further simplify the preparation process, the light-emitting element and the photoelectric conversion element 10 may share these three film layers.

In some embodiments, the substrate 3 includes a pixel driving circuit and a photoelectric conversion output circuit. The pixel driving circuit includes a plurality of first switch transistors 31, one of which is connected to the first electrode 101 of a light-emitting element as a driving transistor configured to drive the light-emitting element to emit light. The photoelectric conversion output circuit includes a second switch transistor 32 connected to a photoelectric conversion element 10 and configured to output a current signal converted by the photoelectric conversion element 10.

In some embodiments, in the repetitive unit 1, centers of light-emitting regions of the two second light-emitting elements 12 have an equal distance b1 to the connection line between centers of the light-emitting regions of the first light-emitting element 11 and the third light-emitting element 13; and centers of light-receiving regions of the two photoelectric conversion elements 10 have an equal distance b2 to the connection line between centers of the light-emitting regions of the first light-emitting element 11 and the third light-emitting element 13.

Here, the light-emitting region of a light-emitting element refers to an opening region in the pixel defining layer 4 where the light-emitting element is located; and the center of the light-emitting region is a geometric center of a regularly shaped light-emitting region, or a center of gravity of an irregularly shaped light-emitting region. The light-receiving region of each photoelectric conversion element 10 refers to an opening region in the pixel defining layer 4 where the photoelectric conversion element 10 is located; and the center of the light-receiving region is a geometric center of a regularly shaped light-receiving region, or a center of gravity of an irregularly shaped light-receiving region.

In some embodiments, the first direction X is perpendicular to the second direction Y; and in the repetitive unit 1, a distance c1 between the center of the light-emitting region of one second light-emitting element 12 and the center of the light-receiving region of one photoelectric conversion element 10 in one corresponding set is equal to a distance c2 between the center of the light-emitting region of the other second light-emitting element 12 and the center of the light-receiving region of the other photoelectric conversion element 10 in the other corresponding set. Since the photoelectric conversion elements 10 are sensitive to green light, the equal distances c1 and c2 enable a high degree of coincidence and uniformity of recognition regions P of adjacent photoelectric conversion elements 10, thereby improving the fingerprint recognition performance of the photoelectric conversion elements 10.

In some embodiments, in the repetitive unit 1, the centers of the light-emitting regions of the first light-emitting element 11 and the third light-emitting element 13 are located on a same straight line in the first direction X. The light-emitting region of the third light-emitting element 13 has an area larger than the light-emitting region of the second light-emitting element 12, and the light-emitting region of the second light-emitting element 12 has an area larger than the light-emitting region of the first light-emitting element 11. Since a lifetime of the third light-emitting element 13 depends on the area of the light-emitting region of the third light-emitting element 13, and the third light-emitting element 13 has the shortest lifetime compared to other colors of light-emitting elements, the lifetime of different colors of light-emitting elements can be increased with such arrangement, thereby increasing the lifetime of the display substrate.

In some embodiments, the light-emitting region of the first light-emitting element 11 has a first maximum width R1 in the first direction X, and a second maximum width R2 in the second direction Y; $0.67 \le$ a ratio of the first maximum width R1 to the second maximum width $R2 \le 1.5$; the first maximum width $R1 \ge 20$ μm; and the second maximum width $R2 \ge 20$ μm. Such width settings of the first light-emitting element 11 can reduce a difference in display width between horizontal lines in the first direction X and vertical lines in the second direction Y on the display substrate.

In some embodiments, the light-emitting region of the third light-emitting element 13 has a third maximum width B1 in the first direction X, and a fourth maximum width B2 in the second direction Y; $0.67 \le$ the third maximum width B1/the fourth maximum width $B2 \le 1.5$; the third maximum width $B1 \ge 20$ μm; and the fourth maximum width $B2 \ge 20$ μm.

In some embodiments, in the repetitive unit 1, the light-emitting regions of the two second light-emitting elements 12 has a minimum distance $d \ge 20$ μm. Here, the minimum distance d is a distance between adjacent sides of the two second light-emitting elements 12. Such setting of the minimum distance d can reduce a sawtooth feeling generated by the display of horizontal lines of the display substrate in the first direction X, and thus improve the display effect of the display substrate.

Due to a proportional relationship of different colors of light in the white light synthesis, a same degree of variation of the blue light, the red light and the green light has sequentially reduced influences on color shift of the white light. Therefore, in the embodiments of the present disclosure, only width ratios of the first light-emitting element 11 and the third light-emitting element 13 are set, while a width ratio of the second light-emitting element 12 is not limited in consideration of a total aperture ratio of the display substrate, so that a higher aperture ratio of the display substrate can be ensured, and the photoelectric conversion element 10 can be more suitable for a display substrate configured with the color filter layer 2.

In some embodiments, the light-receiving region of each photoelectric conversion element 10 has an area greater than 100 μm$^2$. In this manner, the photoelectric conversion element 10 can better receive light emitted from different colors of light-emitting elements, so that a more accurate fingerprint recognition function can be achieved and the requirement of safer fingerprint payment can be met.

In some embodiments, referring to FIGS. 3 to 5, the plurality of repetitive units 1 are arranged in an array, with a row direction of the array along the first direction X and a column direction of the array along the second direction Y; repetitive units 1 in any two adjacent rows of repetitive units 1 are located in different columns; photoelectric conversion elements 10 which are close to each other along the second direction Y in any two adjacent rows of repetitive units 1 are located on a same straight line in the first direction X; an m$^{th}$ repetitive unit 1 in an n$^{th}$ row of repetitive units 1 and an m$^{th}$ repetitive unit 1 in an $(n+2)^{th}$ row of repetitive units 1 are located on a same straight line in the second direction Y; where n=1, 2, 3 . . . , and n is an integer; m=1, 2, 3 . . . , and m is an integer; and in the array, a distance e1 between any two adjacent photoelectric conversion elements 10 on a same straight line in the second direction Y is equal to a distance e2 between any two adjacent photoelectric conversion elements 10 on a same straight line in the first direction X.

The distances e1 and e2 are distances between the centers of the light-receiving regions of the respective photoelectric conversion elements 10. It should be noted that for photoelectric conversion elements 10 with regularly shaped light-receiving regions, the distances e1 and e2 may be distances between adjacent sides of the respective photoelectric conversion elements 10.

Figure 8:
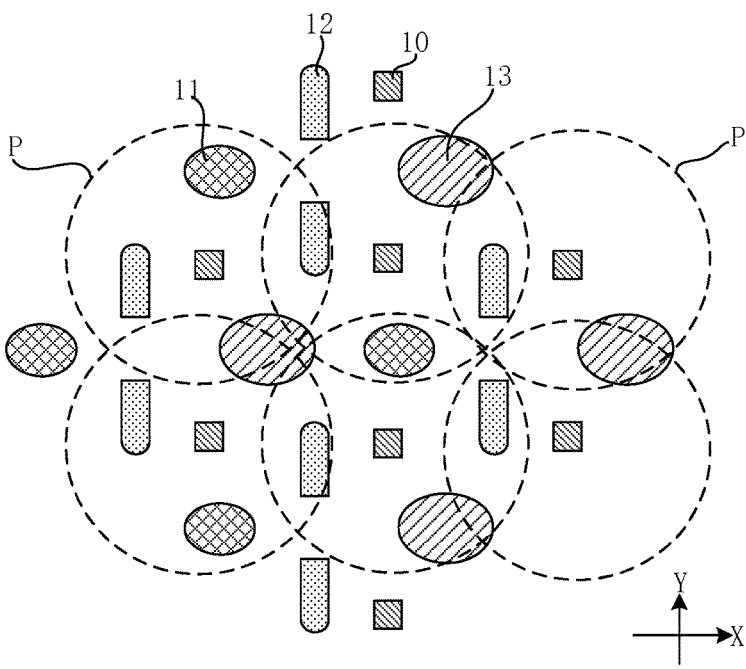
FIG. 8 is a schematic diagram illustrating a recognition region of a photoelectric conversion element according to an embodiment of the present disclosure.
Figure 9:
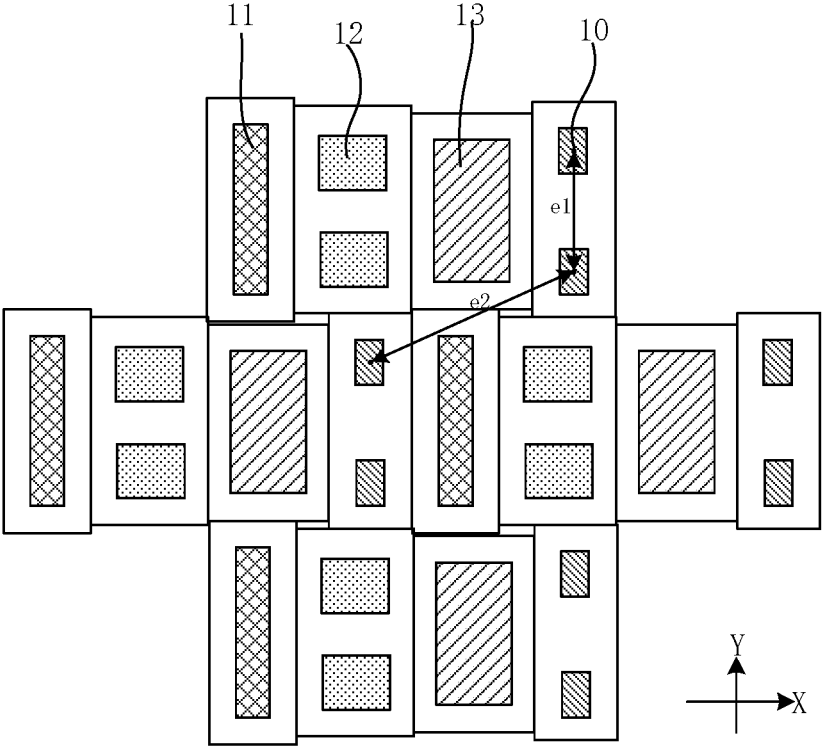
FIG. 9 is a schematic diagram illustrating an arrangement of photoelectric conversion elements in the disclosed art.

Referring to FIG. 8, a schematic diagram illustrating a recognition region of a photoelectric conversion element according to an embodiment of the present disclosure is shown. FIG. 9 is a schematic diagram illustrating an arrangement of photoelectric conversion elements in the existing art. With the above arrangement and distances of the photoelectric conversion elements 10 in the array of the repetitive unit 1, a high degree of coincidence and uniformity of recognition regions P of adjacent photoelectric conversion elements 10 are achieved, thereby improving the fingerprint recognition performance of the photoelectric conversion elements 10. Meanwhile, the photoelectric conversion element 10 can better receive light emitted from different colors of light-emitting elements, so that a more accurate fingerprint recognition function can be achieved and the requirement of safer fingerprint payment can be met. In the disclosed art, as shown in FIG. 9, the distance e2 is much longer than the distance e1, making the photoelectric conversion elements 10 unable to meet the requirement of safer fingerprint payment.

In some embodiments, referring to FIG. 4, in two adjacent repetitive units 1 in two adjacent but different rows, the center of the light-receiving region of a photoelectric conversion element 10 located between two second light-emitting elements 12 adjacent in the first direction X has an equal distance f1 (f2) to the centers of the light-emitting regions of the two second light-emitting elements 12. Specifically, the equal distance f1 (f2) may be obtained by rotating the photoelectric conversion element 10 by a certain angle (e.g., 60°) and/or finely adjusting a position of the photoelectric conversion element 10. Since the photoelectric conversion elements 10 are sensitive to green light, the equal distance f1 (f2) enables a high degree of coincidence and uniformity of recognition regions P of adjacent photoelectric conversion elements 10, thereby improving the fingerprint recognition performance of the photoelectric conversion elements 10.

In some embodiments, each photoelectric conversion element 10 includes a functional layer; the first light-emitting element 11 and the third light-emitting element 13 each include a light-emitting layer; and at least one side/edge of the functional layer is parallel to at least one side/edge of the light-emitting layer in an adjacent first light-emitting element 11 or third light-emitting element 13. With such arrangement, an aperture ratio of the light-emitting element, and thus a display aperture ratio of the display substrate, can be increased.

In some embodiments, the light-emitting region of the first light-emitting element 11 has any one of a circular shape, an elliptical shape, a triangular shape, a rectangular shape, a diamond shape or a regular polygon shape; the light-emitting region of the third light-emitting element 13 has any one of a circular shape, an elliptical shape, a triangular shape, a rectangular shape, a diamond shape or a regular polygon shape; and the light-receiving region of each photoelectric conversion element 10 has any one of a square shape, a circular shape, or a regular polygon shape.

In this embodiment, the light-emitting regions of the first light-emitting element 11 and the third light-emitting element 13 both have an elliptical or rectangular shape; and the light-receiving region of each photoelectric conversion element 10 has a square shape.

In some embodiments, the light-emitting region of each second light-emitting element 12 has a strip shape, with a length direction along the second direction Y.

The different colors of light-emitting elements with light-emitting regions in the above shapes and the above photoelectric conversion elements 10 can be tightly nested with each other, so that a display aperture ratio of the display substrate can be improved, and thus a service life of the display substrate can be prolonged.

In some embodiments, an angular shape of the first light-emitting element 11, the second light-emitting elements 12, the third light-emitting element 13 or the photoelectric conversion elements 10 may be embodied in a rounded or curved corner in an actual finished product. With such arrangement, it is also beneficial to enabling tight nesting of the different colors of light-emitting elements and the photoelectric conversion elements 10 with each other, so that a display aperture ratio of the display substrate can be improved, and thus a service life of the display substrate can be prolonged.

In the embodiment of the present disclosure, with the above settings of the number and arrangement of the different colors of light-emitting elements and the photoelectric conversion elements 10 in the repetitive unit 1, high-resolution display of the display substrate can be implemented on the one hand; and on the other hand, the photoelectric conversion element 10 can better receive light emitted from different colors of light-emitting elements, so that a more accurate fingerprint recognition function can be achieved and the requirement of safer fingerprint payment can be met. Furthermore, for a display substrate configured with the color filter layer, the arrangement of the repetitive units 1 can reduce influences of the color filter layer on the light emitted from different colors of light-emitting elements, so as to better implement the fingerprint recognition function of the photoelectric conversion element 10. Even further, the arrangement of the repetitive units 1 can ensure a relatively high aperture ratio of the display substrate, and aperture rules on the metal mask used in evaporation formation of the different colors of light-emitting elements and the photoelectric conversion elements 10 can facilitate stretch and use of the metal mask, and improve the yield and performance of the product.

In a second aspect, an embodiment of the present disclosure further provides a method for preparing a display substrate as described above, including: forming a first light-emitting element, second light-emitting elements, a third light-emitting element, and photoelectric conversion elements in a repetitive unit by evaporation.

Each film layer of the different colors of light-emitting elements and each film layer of the photoelectric conversion elements may be prepared through an evaporation process. In some embodiments, the hole transport layers, the electron transport layers and the second electrodes of the different colors of light-emitting elements and the photoelectric conversion elements may be prepared through a single evaporation process, respectively, and the first electrodes of the different colors of light-emitting elements and the third electrodes of the photoelectric conversion elements may also be prepared through a single evaporation process or patterning process, so as to simplify the preparation process of the display substrate.

In some embodiments, two second light-emitting elements in the repetitive unit are simultaneously formed by evaporation through one mask opening in a metal mask. In this manner, an aperture opening ratio of the second light-emitting elements on the display substrate can be increased, so as to favorably reduce influences of changes in the blue light and the red light on the color shift of the white light, and improve the display effect of the display substrate. Meanwhile, the second light-emitting elements in the repetitive unit can be prepared through a single mask process, which simplifies the preparation process of the second light-emitting elements.

In some embodiments, two photoelectric conversion elements in the repetitive unit are simultaneously formed by evaporation through two mask openings in a metal mask. With such preparation, on the one hand, the two photoelectric conversion elements in the repetitive unit can be prevented from shielding the first light-emitting element or the third light-emitting element positioned therebetween during the preparation process, thereby ensuring the resolution of the display substrate; and on the other hand, the method of the present disclosure, compared with the method of simultaneously forming two photoelectric conversion elements by evaporation through one mask opening in a metal mask, can improve a distribution quantity of photoelectric conversion elements on the display substrate, so that a more accurate fingerprint recognition function can be achieved and the requirement of safer fingerprint payment can be met.

In a third aspect, an embodiment of the present disclosure further provides a display panel, including the display substrate in any of the above embodiments.

By adopting the display substrate in any of the above embodiments, high-resolution display of the display panel can be implemented on the one hand; and on the other hand, a more accurate fingerprint recognition function of the display panel can be achieved and the requirement of safer fingerprint payment can be met. Furthermore, the display effect of the display panel can be improved. Even further, a high aperture ratio and better yield and performance of the display panel can be ensured.

In a fourth aspect, an embodiment of the present disclosure further provides a display apparatus including the display panel according to any one of the above embodiments.

By adopting the display panel in any of the above embodiments, high-resolution display of the display apparatus can be implemented on the one hand; and on the other hand, a more accurate fingerprint recognition function of the display apparatus can be achieved and the requirement of safer fingerprint payment can be met. Furthermore, the display effect of the display apparatus can be improved. Even further, a high aperture ratio and better yield and performance of the display apparatus can be ensured.

The display apparatus may be: an OLED panel, an OLED television, a mobile phone, a tablet, a laptop, a monitor, a digital album, a GPS or any other product or component having a display function.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display substrate, comprising: a plurality of repetitive units; wherein each repetitive unit comprises a first light-emitting element, second light-emitting elements, a third light-emitting element, and photoelectric conversion elements;

the first light-emitting element and the third light-emitting element are provided in a same number; the second light-emitting elements and the photoelectric conversion elements are provided in a same number; the second light-emitting elements are twice as many as the first light-emitting element;

the first light-emitting element, the second light-emitting elements, and the third light-emitting element are sequentially arranged along a first direction; the second light-emitting elements are sequentially arranged along a second direction; the photoelectric conversion elements are sequentially arranged along the second direction;

an angle between the first direction and the second direction is larger than 0° and smaller than or equal to 90°;

the photoelectric conversion elements and the second light-emitting elements are adjacently arranged and distributed in one-to-one correspondence; any set of corresponding second light-emitting element and photoelectric conversion element are arranged along the first direction; and the first light-emitting element or the third light-emitting element is located between two adjacent photoelectric conversion elements.

2. The display substrate according to claim 1, wherein in the repetitive unit, a quantity of the first light-emitting element is one, and a quantity of the second light-emitting elements is two;

the two second light-emitting elements are respectively disposed at an upper side and a lower side of a connection line between centers of light-emitting regions of the first light-emitting element and the third light-emitting element; and the photoelectric conversion elements whose quantity is two are respectively disposed at the upper side and the lower side of the connection line between centers of the light-emitting regions of the first light-emitting element and the third light-emitting element.

3. The display substrate according to claim 2, wherein in the repetitive unit, centers of light-emitting regions of the two second light-emitting elements have an equal distance to the connection line between centers of the light-emitting regions of the first light-emitting element and the third light-emitting element; and centers of light-receiving regions of the two photoelectric conversion elements have an equal distance to the connection line between centers of the light-emitting regions of the first light-emitting element and the third light-emitting element.

4. The display substrate according to claim 3, wherein the first direction is perpendicular to the second direction; and in the repetitive unit, a distance between the center of the light-emitting region of one of the second light-emitting elements and the center of the light-receiving region of one of the photoelectric conversion elements in one corresponding set is equal to a distance between the center of the light-emitting region of the other of the second light-emitting element and the center of the light-receiving region of the other of the photoelectric conversion elements in the other corresponding set.

5. The display substrate according to claim 2, wherein in the repetitive unit, the centers of the light-emitting regions of the first light-emitting element and the third light-emitting element are located on a same straight line in the first direction.

6. The display substrate according to claim 5, wherein the light-emitting region of the first light-emitting element has a first maximum width in the first direction, and a second maximum width in the second direction;

$0.67 \leq$ a ratio of the first maximum width to the second maximum width$\leq 1.5$; and the first maximum width $\geq 20$ μm; and the second maximum width $\geq 20$ μm.

7. The display substrate according to claim 6, wherein the light-emitting region of the third light-emitting element has a third maximum width in the first direction, and a fourth maximum width in the second direction;

$0.67 \leq$ a ratio of the third maximum width to the fourth maximum width$\leq 1.5$; and the third maximum width $\geq 20$ μm; and the fourth maximum width $\geq 20$ μm.

8. The display substrate according to claim 7, wherein in the repetitive unit, the light-emitting regions of the two second light-emitting elements has a minimum distance larger than or equal to 20 μm.

9. The display substrate according to claim 8, wherein the light-receiving region of each photoelectric conversion element has an area greater than 100 μm2.

10. The display substrate according to claim 6 wherein the plurality of repetitive units are arranged in an array, with a row direction of the array along the first direction and a column direction of the array along the second direction;

repetitive units in any two adjacent rows of repetitive units are located in different columns;

photoelectric conversion elements which are close to each other along the second direction in any two adjacent rows of repetitive units are located on a same straight line in the first direction;

an mth repetitive unit in an nth row of repetitive units and an mth repetitive unit in an (n+2)th row of repetitive units are located on a same straight line in the second direction, where n=1, 2, 3 . . . , and n is an integer, m=1, 2, 3 . . . , and m is an integer; and in the array, a distance between any two adjacent photoelectric conversion elements on a same straight line in the second direction is equal to a distance between any two adjacent photoelectric conversion elements on a same straight line in the first direction.

11. The display substrate according to claim 10, wherein in two adjacent repetitive units in two adjacent but different rows, the center of the light-receiving region of the photoelectric conversion element located between two second light-emitting elements adjacent in the first direction has an equal distance to the centers of the light-emitting regions of the two second light-emitting elements.

12. The display substrate according to claim 10, wherein each photoelectric conversion element comprises a functional layer;

the first light-emitting element and the third light-emitting element each comprise a light-emitting layer; and at least one side of the functional layer is parallel to at least one side of the light-emitting layer of the first light-emitting element or the third light-emitting element adjacent thereto.

13. The display substrate according to claim 1, further comprising a color filter layer on a light-emitting side of the repetitive unit; wherein the color filter layer comprises color filters and a black matrix;

the display substrate further comprises a substrate and a pixel defining layer on the substrate;

the pixel defining layer has a plurality of openings provided therein, and the first light-emitting element, the second light-emitting elements, the third light-emitting element and the photoelectric conversion elements are respectively located in the openings in one-to-one correspondence;

the first light-emitting element is a red light-emitting element; each second light-emitting element is a green light-emitting element; the third light-emitting element is a blue light-emitting element;

the color filters comprise a red color filter, a green color filter, and a blue color filter;

an orthographic projection of the red color filter on the substrate is overlapped with the light-emitting region of the first light-emitting element; an orthographic projection of the green color filter on the substrate is overlapped with the light-emitting region of each second light-emitting element; an orthographic projection of the blue color filter on the substrate is overlapped with the light-emitting region of the third light-emitting element; and an orthographic projection of the black matrix on the substrate is overlapped with the pixel defining layer.

14. The display substrate according to claim 13, wherein in a region of the repetitive unit, the black matrix has a uniform width which is smaller than a width of the pixel defining layer.

15. The display substrate according to claim 14, wherein in an overlap region of orthographic projections of the black matrix and the pixel defining layer, the black matrix has a first orthographic projection boundary and a second orthographic projection boundary in a width direction of the black matrix; the pixel defining layer has a third orthographic projection boundary and a fourth orthographic projection boundary in a width direction of the pixel defining layer;

the first orthographic projection boundary and the third orthographic projection boundary are located at one end of the black matrix along the width direction of the black matrix; the second orthographic projection boundary and the fourth orthographic projection boundary are located at the other end of the black matrix along the width direction of the black matrix; and a distance between the first orthographic projection boundary and the third orthographic projection boundary is equal to a distance between the second orthographic projection boundary and the fourth orthographic projection boundary.

16. A method for preparing the display substrate according to claim 1, comprising: forming a first light-emitting element, second light-emitting elements, a third light-emitting element, and photoelectric conversion elements in a repetitive unit by evaporation.

17. The method for preparing a display substrate according to claim 16, wherein two second light-emitting elements in the repetitive unit are simultaneously formed by evaporation through one mask opening in a metal mask.

18. The method for preparing a display substrate according to claim 17, wherein two photoelectric conversion elements in the repetitive unit are simultaneously formed by evaporation through two mask openings in a metal mask.

19. A display panel, comprising the display substrate according to claim 1.

20. A display apparatus, comprising the display panel according to claim 19.

* * * * *